US007173844B2

United States Patent
Lee et al.

(10) Patent No.: US 7,173,844 B2
(45) Date of Patent: Feb. 6, 2007

(54) DEVICE AND METHOD FOR GENERATING REFERENCE VOLTAGE IN FERROELECTRIC RANDOM ACCESS MEMORY (FRAM)

(75) Inventors: Han-Joo Lee, Seoul (KR); Kang-Woon Lee, Seoul (KR); Byung-Jun Min, Yongin-si (KR); Byung-Gil Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 11/197,033

(22) Filed: Aug. 4, 2005

(65) Prior Publication Data

US 2006/0028890 A1 Feb. 9, 2006

(30) Foreign Application Priority Data

Aug. 9, 2004 (KR) .................. 10-2004-0062401

(51) Int. Cl.
*G11C 11/22* (2006.01)
(52) U.S. Cl. .................. 365/145; 365/149; 365/211
(58) Field of Classification Search .............. 365/145, 365/149, 189.09, 211
See application file for complete search history.

(56) References Cited

U.S. PATENT DOCUMENTS

| 5,424,975 | A | 6/1995 | Lowrey et al. |
| 6,272,037 | B1 | 8/2001 | Miyamoto |
| 6,906,975 | B2 * | 6/2005 | Kang et al. .................. 365/211 |
| 6,999,335 | B2 * | 2/2006 | Murakuki .................... 365/145 |
| 7,009,907 | B2 * | 3/2006 | Kang ..................... 365/230.03 |
| 7,046,541 | B2 * | 5/2006 | Ogiwara et al. ............ 365/145 |
| 2005/0063213 | A1 * | 3/2005 | Jacob et al. ................ 365/145 |
| 2005/0237782 | A1 * | 10/2005 | Shiraishi ..................... 365/145 |

* cited by examiner

*Primary Examiner*—Richard Elms
*Assistant Examiner*—Hien Nguyen
(74) *Attorney, Agent, or Firm*—F. Chau & Associates, LLC

(57) ABSTRACT

A reference voltage generating device that provides a constant reference voltage even with temperature change in a ferroelectric random access memory and a method for driving the same are provided. A device for generating a reference voltage in a ferroelectric random access memory including memory cells, each of which has one ferroelectric capacitor and one access transistor, includes a reference cell composed of a ferroelectric capacitor and a transistor; a reference plate line connected to one end of the ferroelectric capacitor constituting the reference cell; and a reference plate line driver circuit for adjusting a voltage level of a reference plate line enable signal depending on temperature change so that a constant reference voltage is generated.

16 Claims, 9 Drawing Sheets

DEVICE AND METHOD FOR GENERATING REFERENCE VOLTAGE IN FERROELECTRIC RANDOM ACCESS MEMORY (FRAM)

CROSS-REFERENCE TO RELATED APPLICATION

This application claims the benefit of Korean Patent Application No. 10-2004-0062401, filed Aug. 9, 2004, the disclosure of which is incorporated by reference herein in its entirety.

TECHNICAL FIELD

The present invention relates to a nonvolatile ferroelectric semiconductor memory that uses memory cells having ferroelectric capacitors, and more particularly, to generating a reference voltage for sensing amplifying operation upon reading data stored in a memory cell of a ferroelectric random access memory.

DISCUSSION OF RELATED ART

In recent years, a memory device has been developed that is capable of operation without the need for refresh as in a Dynamic Random Access Memory (DRAM) device, such memory devices provide mass capacity by using a ferroelectric thin film as a dielectric film of a capacitor. A Ferroelectric Random Access Memory (FRAM) is a type of non-volatile memory device that uses such a ferroelectric thin film and preserves stored information even when the memory loses power. In addition, a FRAM has high-speed access, less power consumption, and excellent shock-resistance. Accordingly, a FRAM can be expected to be used as a main storage device for various electronic devices and equipment having file storing and retrieving functions, such as portable computers, cellular phones, and game machines, or as a recording medium for recording voice or images.

In the FRAM, a memory cell is composed of a ferroelectric capacitor and an access transistor and stores logical data '1' or '0' depending on an electrical polarization state of the ferroelectric capacitor. When a voltage is applied across the ferroelectric capacitor, a ferroelectric material is polarized according to the direction of an electric field. Here, a switching threshold voltage at which a change in the polarization state of the ferroelectric material occurs is called a "coercive voltage". In reading data stored in the memory cell, a voltage is applied between both electrodes of the ferroelectric capacitor to cause a potential difference therebetween, and accordingly excite charges on a bit line. The state of the data stored in the memory cell is sensed as a change in an amount of the charges excited on the bit line.

FIG. 1 illustrates a hysteresis curve of a typical ferroelectric material constituting a ferroelectric capacitor.

When a ground voltage Vss or 0 V, i.e., no electric field is applied to the ferroelectric material, polarization does not occur as shown in FIG. 1. Increase in a voltage across the ferroelectric capacitor in a positive direction leads to polarization degree (or charge amount) increase from zero to a state point A in a positive polarization area. The polarization at the state point A occurs in one direction and the polarization degree at the state point A reaches a maximum value. Here, the polarization degree, i.e., the amount of charges reserved by the ferroelectric material is indicated by +Qs. The polarization degree does not decrease to zero but remains at a state point B even though the voltage across the capacitor drops to a voltage Vss.

The amount of the charges reserved by the ferroelectric material depend on the remanent polarization, i.e., remanent polarization degree is indicated by +Qr. When the voltage across the capacitor increases in a negative direction, the polarization degree shifts from the state point B to a state point C in a negative charge polarization area. At the state point C, the ferroelectric material is polarized in a direction opposite to the polarization direction at the state point A. In this case, the polarization degree is indicated by −Qs. The polarization degree does not drop to zero but remains at a state point D even though the voltage across the capacitor drops to the voltage Vss. In this case, the remanent polarization degree is indicated by −Qr. When the voltage applied across the capacitor further increases in the positive direction, the polarization degree of the ferroelectric material shifts from the state point D to the state point A.

FIG. 2 illustrates a memory cell constituting a memory cell array in a conventional ferroelectric random access memory device.

As shown in FIG. 2, the memory cell is composed of one access transistor M1 and one ferroelectric capacitor $C_{FE}$. The access transistor M1 has two terminals, i.e., a source terminal and a drain terminal connected to one terminal of the ferroelectric capacitor $C_{FE}$ and a bit line BL, respectively, and a gate connected to a word line WL. The other terminal of the ferroelectric capacitor $C_{FE}$ is connected to a plate line PL.

When a voltage for generating an electric field is applied to the ferroelectric capacitor having a ferroelectric material inserted between two electric electrodes as described above, a polarization direction dependent on spontaneous polarization is kept unchanged even though the electrodes achieve a floating state. Surface charges of the ferroelectric material due to the spontaneous polarization do not undergo natural dissipation due to leakage and other similar reasons. The polarization direction is kept unchanged unless the voltage is applied to the ferroelectric capacitor in an opposite direction so that the polarization degree becomes zero.

When the positive voltage is applied to the ferroelectric capacitor and then eliminated, the remanent polarization of the ferroelectric material constituting the ferroelectric capacitor comes into a +Qr state. Further, when a negative voltage is applied to the ferroelectric capacitor and then eliminated, the remanent polarization of the ferroelectric material comes into a −Qr state. Here, when the remanent polarization state of +Qr, i.e., a logical state at the state point B is assumed to represent data '0', the remanent polarization state of −Qr, i.e., a logical state at the state point D represents data '1'. Accordingly, the data stored in the memory cell is read by discriminating between a charge amount difference upon shift from the state point A to the state point B, i.e., a voltage corresponding to Qnsw and a charge amount difference upon shift from the state point D to the state point A, i.e., a voltage corresponding to Qsw.

There is a need for a separate reference voltage generating device for generating a reference voltage having an intermediate voltage value between a bit line voltage value when the sense amplifier reads data '1' and a bit line voltage value when the sense amplifier reads data '0' to amplify and sense small change in the voltage at the bit line in reading the data stored in the memory cell as described above.

A method for generating the reference voltage includes a method using a paraelectric capacitor as a reference cell, and a method using a ferroelectric capacitor as a reference cell. The method using the paraelectric capacitor with low permittivity is not suitable for a high-integrated memory because a larger area of the capacitor affects a chip size. The method using the ferroelectric capacitor is classified into two methods: one using non-switching area capacitance of the hysteresis curve of FIG. 1, i.e., a Qnsw value as the reference voltage by adjusting the size of the ferroelectric capacitor, and the other using a half value between the switching capacitance and the non-switching capacitance. Another process uses a switching area capacitance, i.e., a Qsw value, of the hysteresis curve of FIG. 1 as the reference voltage. However, the use of the ferroelectric capacitor is an advantage in the chip size, but is difficult to supply a stable reference voltage due to an essential ferroelectric property. It degrades the reliability of the memory device.

FIG. 3 illustrates a ferroelectric random access memory device that includes a reference voltage generating device which uses non-switching area capacitance of a conventional ferroelectric capacitor.

As shown in FIG. 3, the ferroelectric random access memory device with a conventional reference voltage generating device includes a main memory cell array 10 having a plurality of ferroelectric random access memory cells 20 and 30, a reference voltage generating device 80 having a reference cell array 40 of reference cells 50 and 60, and a sense amplifier (not shown).

The main memory cell array 10 is composed of memory cells having the structure as shown in FIG. 2. That is, the main memory cell array 10 is configured so that memory cells 20 and 30 is each composed of one ferroelectric capacitor $C_{FE1}$ or $C_{FE2}$ and one access transistor M1 or M2 that are arranged at intersections of rows and columns. Further, the access transistor M1 or M2 constituting the memory cell 20 or 30 is connected to one word line $WL_0$ or $WL_1$. The ferroelectric capacitor $C_{FE1}$ or $C_{FE2}$ constituting the memory cell 20 or 30 has one end connected to a plate line PL and the other end connected to a bit line BL or BLB via the access transistor M1 or M2.

The word lines $WL_0$ and $WL_1$ are connected to each word line decoder and driver circuit (not shown). The plate line PL is connected to a plate line driver circuit (not shown) that provides a plate line enable signal to the plate line PL in response to a plate driver enable signal.

The reference voltage generating device 80 includes a reference cell array 40, a reference word line decoder and driver circuit (not shown) that provides a reference word line enable signal to reference word lines $RWL_0$ and $RWL_1$, and a reference plate line driver (not shown) that provides a reference plate line enable signal to a reference plate line RPL.

The reference cell 50 or 60 constituting the reference cell array 40 is composed of one ferroelectric capacitor $C_{REF1}$ or $C_{REF2}$ and one access transistor RC1 or RC3, such that each cell has an identical or similar structure to that of the ferroelectric main memory cell 20 or 30.

The ferroelectric capacitor $C_{REF1}$ or $C_{REF2}$ constituting the reference cell 50 or 60 has capacitance greater than that of the ferroelectric capacitor $C_{FE1}$ or $C_{FE2}$ constituting the memory cell 20 or 30.

In the reference cell array 40, the reference cell 50 or 60 has an identical or similar structure to that of the main memory cell 20 or 30 and is arranged at an intersection between a row and a column. Further, the access transistor RC1 or RC3 of the reference cell 50 or 60 is connected to the reference word line $RWL_0$ or $RWL_1$, the ferroelectric capacitor $C_{REF1}$ or $C_{REF2}$ of the reference cell 50 or 60 has one end connected to the reference plate line RPL and the other end connected to the bit line BL or BLB via the access transistor RC1 or RC3. The reference cell 50 or 60 may further include transistors RC2 or RC4 connected between the other end of the ferroelectric capacitor $C_{REF1}$ or $C_{REF2}$ and the ground VSS for pre-charging the reference cell 50 or 60 with a pre-charge signal RBP.

The reference word line decoder and driver circuits are connected to the reference word lines $RWL_0$ and $RWL_1$ to provide a reference word line enable signal.

The reference plate line driver circuit provides a constant level of reference plate line enable signal to the reference plate lines RPL in response to the reference plate line driver enable signal.

The sense amplifiers are correspondingly connected to bit lines BL and BLB which are connected to the main memory cells and the reference cells in common. The sense amplifiers compare a voltage level of positive bit lines BL and BLB connected to the main memory cell to a voltage level of the negative bit lines BLB and BL connected to the reference cell in order to sense and read the data in a selected main memory cell.

Additionally, the reference cell may include transistors Q1 and Q2 for pre-charging the bit lines BL and BLB.

FIG. 4 is a timing diagram based upon the reading of data in a main memory cell of the conventional ferroelectric random access memory device (FRAM) device of FIG. 3. An example is discussed below in which data stored in a memory cell 20 of the FRAM device is read.

As shown in FIGS. 3 and 4, before a read operation is initiated, a pre-charge signal PRE on the positive bit line BL connected to the memory cell 20 and the negative bit line BLB connected to the reference cell 60 is enabled, pre-charging the bit lines. As soon as the read operation is initiated, the pre-charge signal PRE on the positive bit line BL and the negative bit line BLB is disabled. A pre-charge signal RBP on the reference cell 60 is also disabled.

The word line $WL_0$ and the reference word line $RWL_0$, which are selected by the word line enable signal and the reference word line enable signal, respectively, are then enabled, and the plate line PL is enabled. Further, the reference plate line RPL is enabled at a constant level.

When a voltage (i.e., data '1' or '0') corresponding to data in the selected main memory cell 20 is exited to the positive bit line BL and a reference voltage is provided to the negative bit line BLB to which the reference cell 60 is connected, the sense amplifier senses a voltage difference between the bit lines BL and BLB to read the data.

When the data stored in the memory cell 20 is data '0' as the reference word line $RWL_0$ is disabled before the sense amplifier completes the data sensing operation, the data in the reference cell 60 should not be inverted. The reference pre-charge signal RBP is then disabled and the reference plate line RPL is disabled. Further, after the plate line PL is disabled, the word line $WL_0$ is disabled such that data in the memory cell returns as original data. The bit line pre-charge signal PRE is then enabled.

The conventional reference voltage generating device using ferroelectric non-switching area capacitance is designed so that the reference voltage has an intermediate value between a voltage value corresponding to the data '1' and a voltage value corresponding to the data '0'. However, the ferroelectric capacitors $C_{REF1}$ and $C_{REF2}$ constituting the reference cells 50 and 60, respectively, sensitively reacts to temperature change due to an essential property, leading to a change in the reference voltage.

FIG. 5 is a graph illustrating a change in a reference voltage depending on a temperature change in a conventional reference voltage generating device.

As a temperature T increases, a bit line voltage VBL(1) corresponding to data '1' stored in the memory cell decreases at a certain rate while a bit line voltage VBL (0) corresponding to data '0' increases at a certain rate, as shown in FIG. 5. In this case, a reference voltage Vref(Qnsw) based on non-switching area capacitance of a ferroelectric capacitor increases with the increasing temperature T, reducing a sensing margin Vsm(1) of the data '1'. In addition, a reference voltage Vref(Qsw) based on switching area capacitance of the ferroelectric capacitor decreases with the increasing temperature T, reducing a sensing margin Vsm(0) of the data '0'.

SUMMARY OF THE INVENTION

One aspect of the present invention is directed to providing a device for generating a reference voltage in a ferroelectric random access memory (FRAM) and a method for driving the same.

Another aspect of the present invention is directed to providing a device for generating a reference voltage in an FRAM, which is insensitive to and stabilized against a temperature change and is capable of providing a constant reference voltage, and a method for driving the same.

According to an aspect of the present invention, there is provided a device for generating a reference voltage in a ferroelectric random access memory having memory cells that each have one ferroelectric capacitor and one access transistor. In an embodiment, the device includes: a reference cell having one ferroelectric capacitor and at least one transistor; a reference plate line connected to one end of the ferroelectric capacitor; and a reference plate line driver circuit for adjusting a voltage level of a reference plate line enable signal depending on temperature change.

In another embodiment, the reference cell can include a ferroelectric capacitor having one end connected to the reference plate line; and an access transistor connected between the other end of the ferroelectric capacitor and a bit line and having a gate connected to a reference word line. The reference cell can further include a transistor connected between the other end of the ferroelectric capacitor to which the access transistor is connected and a ground for precharging the reference cell.

The ferroelectric capacitor in the reference cell can have capacitance greater than that of the ferroelectric capacitor in the memory cell, the reference voltage may be generated by using non-switching area capacitance of the ferroelectric capacitor in the reference cell, and the voltage level of the reference plate line enable signal can have a negative temperature coefficient.

In an embodiment, the ferroelectric capacitor in the reference cell can have a capacitance smaller than that of the ferroelectric capacitor constituting the memory cell. The reference voltage may be generated by using switching area capacitance of the ferroelectric capacitor constituting the reference cell; and the voltage level of the reference plate line enable signal may have a positive temperature coefficient.

In another embodiment, the reference plate line driver circuit can include a temperature detector for outputting a voltage of a level corresponding to the temperature change; a current mirror type differential amplifier for amplifying the signal output from the temperature detector; an oscillator for generating a pulse in response to an output from the differential amplifier; a charge pumping circuit for generating a control signal in response to the pulse generated by the oscillator; and a switching device for generating the reference plate line enable signal in response to the control signal.

According to yet another aspect of the present invention, there is provided a method for driving a reference voltage generating device for a ferroelectric random access memory including memory cells, each of them having one ferroelectric capacitor and one access transistor. In one embodiment, the method includes; applying a reference driver enable signal; controlling a voltage level of a reference plate line enable signal by means of a control signal having a voltage level corresponding to temperature change, the reference plate line enable signal being applied to a reference plate line connected to a reference cell; and generating a reference voltage having a constant level in response to the controlled reference plate line enable signal.

In an embodiment, the reference voltage can be generated by using non-switching area capacitance of the ferroelectric capacitor constituting the reference cell, and the voltage level of the reference plate line enable signal may have a negative temperature coefficient.

In an embodiment, the reference voltage can be generated by using switching area capacitance of the ferroelectric capacitor constituting the reference cell, and the voltage level of the reference plate line enable signal may have a positive temperature coefficient.

One or more embodiments of the invention enable generation of a constant reference voltage even when the external temperature varies.

BRIEF DESCRIPTION OF THE DRAWINGS

Preferred embodiments of the invention are described with reference to the accompanying drawings, of which.

DETAILED DESCRIPTION OF THE INVENTION

Preferred embodiments of the present invention will be described with reference to the appended drawings.

Figure 6:
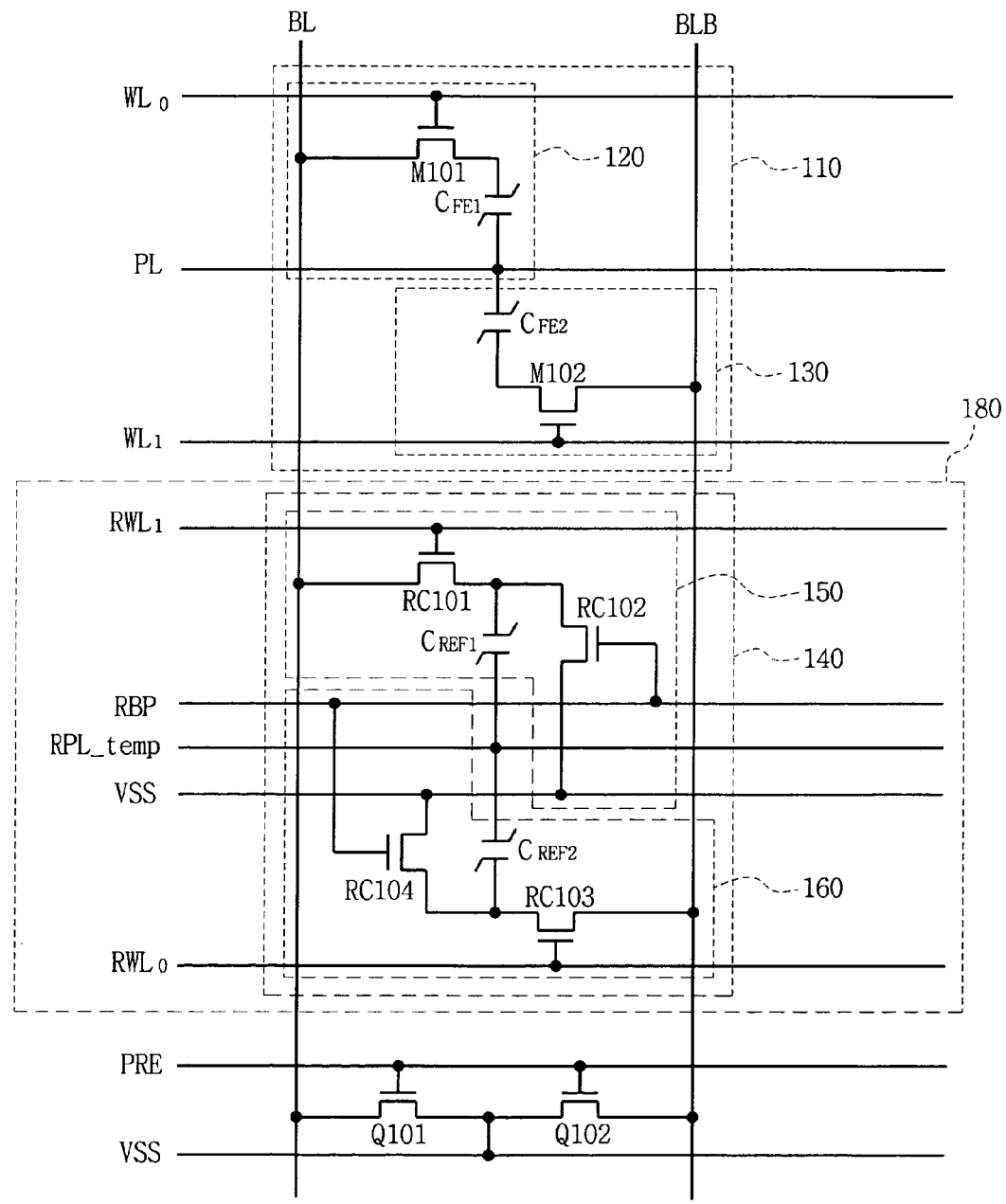
FIG. 6 is a circuit diagram illustrating a ferroelectric random access memory device with a reference voltage generating device according to an embodiment of the present invention.

FIG. 6 illustrates a ferroelectric random access memory device with a reference voltage generating device according to an embodiment of the present invention. The reference voltage generating device is implemented to generate a reference voltage using switching area capacitance or non-switching area capacitance of a ferroelectric capacitor constituting a reference cell.

As shown in FIG. 6, the ferroelectric random access memory device with a reference voltage generating device according to an embodiment of the present invention largely includes a main memory cell array 110 of a plurality of ferroelectric random access memory cells 120 and 130, a reference voltage generating device 180 having a reference cell array 140 of reference cells 150 and 160, a sense amplifier (not shown), and the like.

Figure 2:
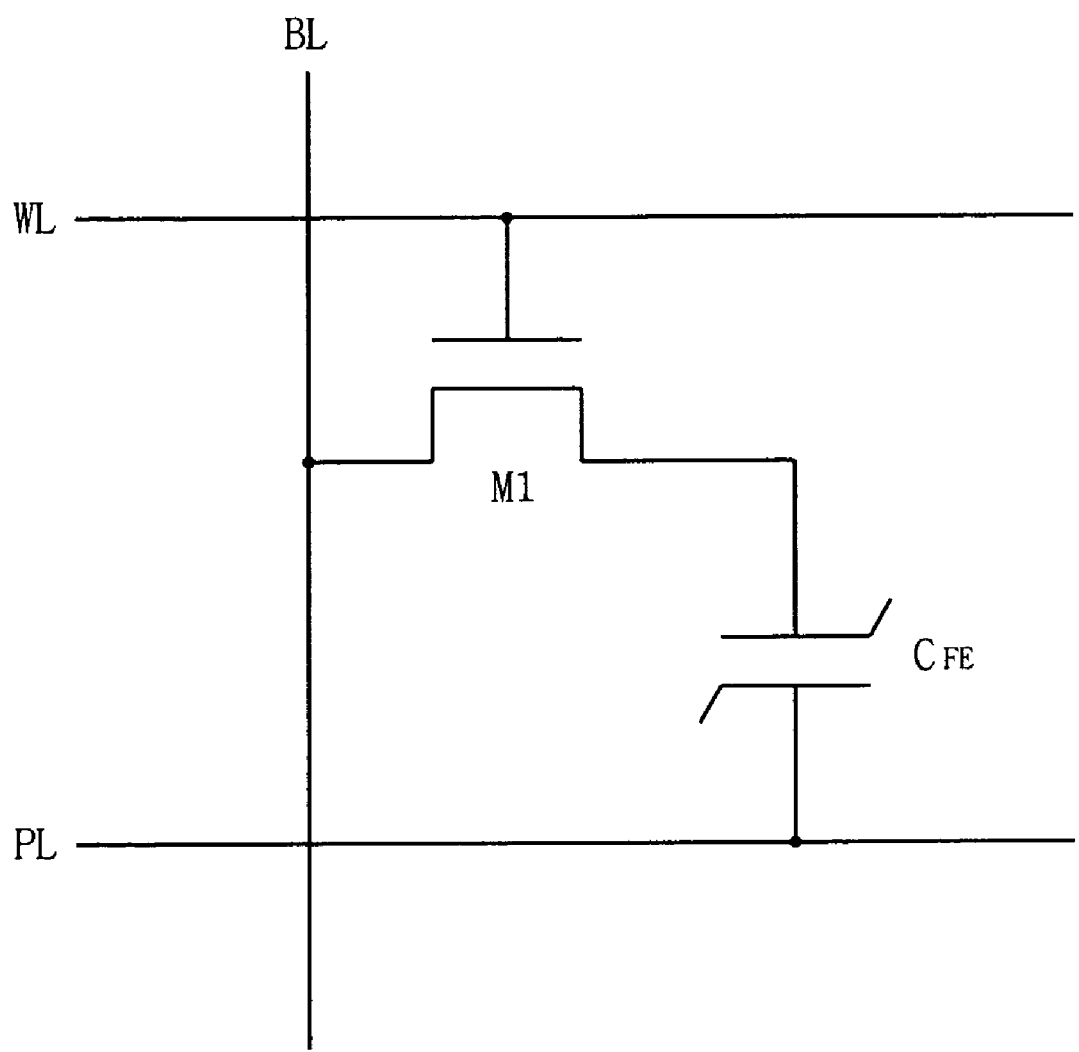
FIG. 2 is a circuit diagram illustrating a memory cell constituting a memory cell array in a typical ferroelectric random access memory device.
Figure 3:
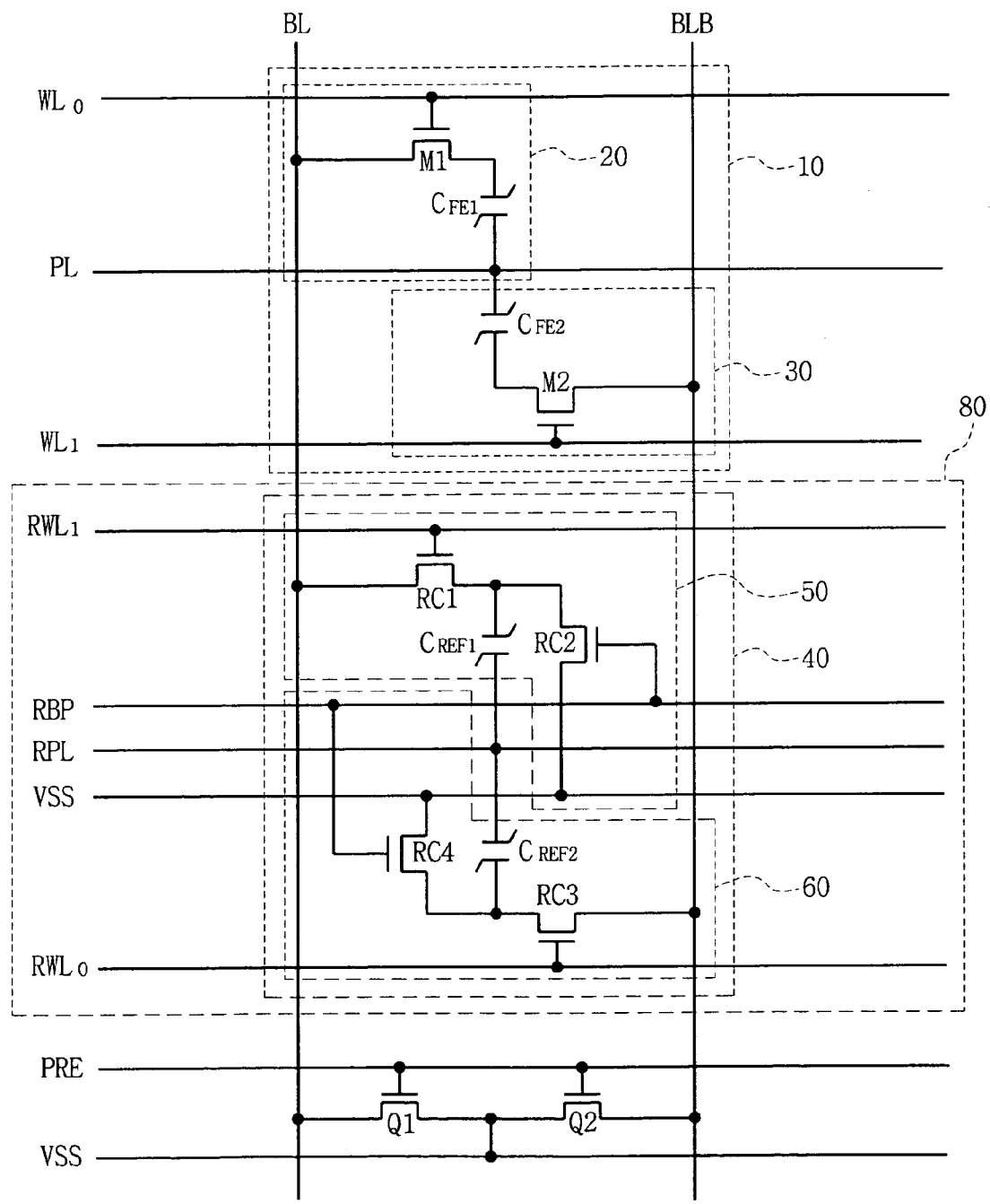
FIG. 3 is a circuit diagram illustrating a ferroelectric random access memory device having a reference voltage generating device which uses a non-switching area capacitance of a conventional ferroelectric capacitor.
Figure 4:
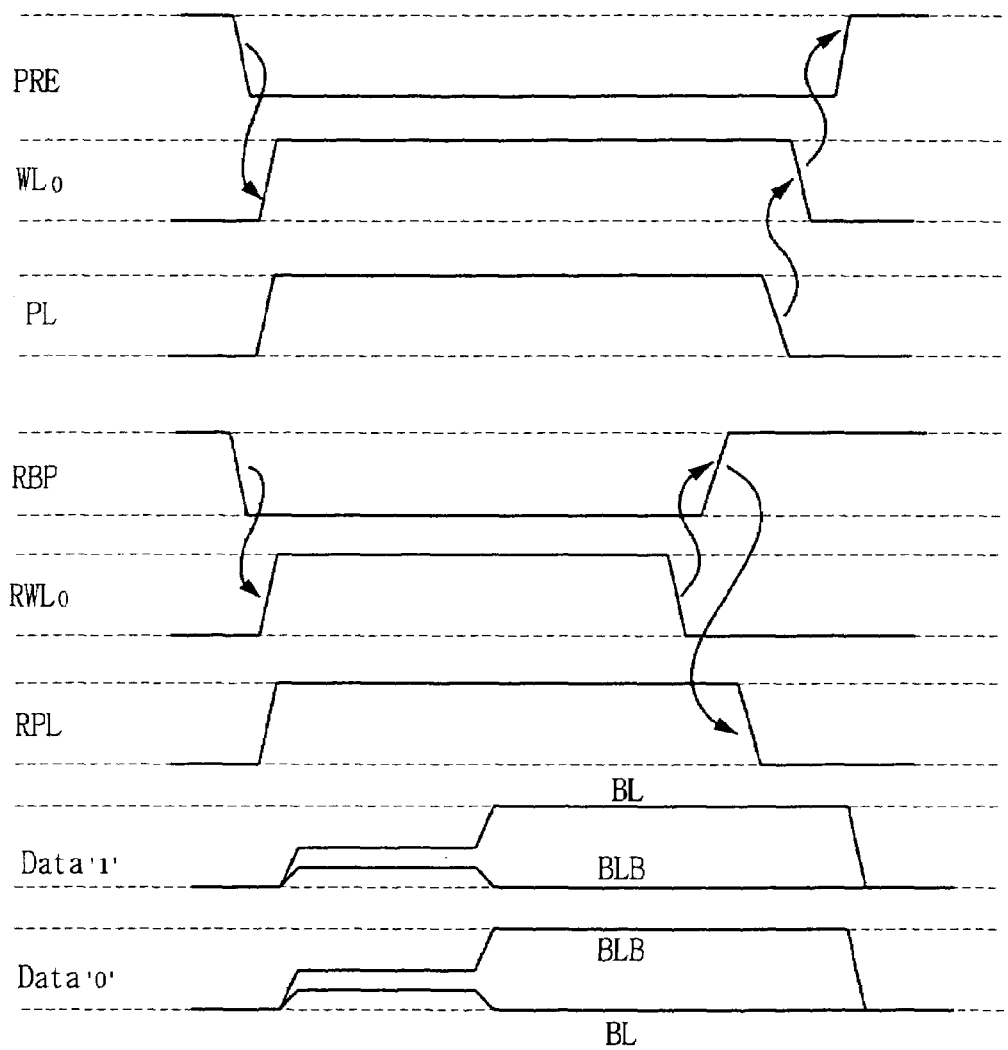
FIG. 4 is a timing diagram showing data in a main memory cell of the conventional ferroelectric random access memory device (FRAM) device of FIG. 3.
Figure 5:
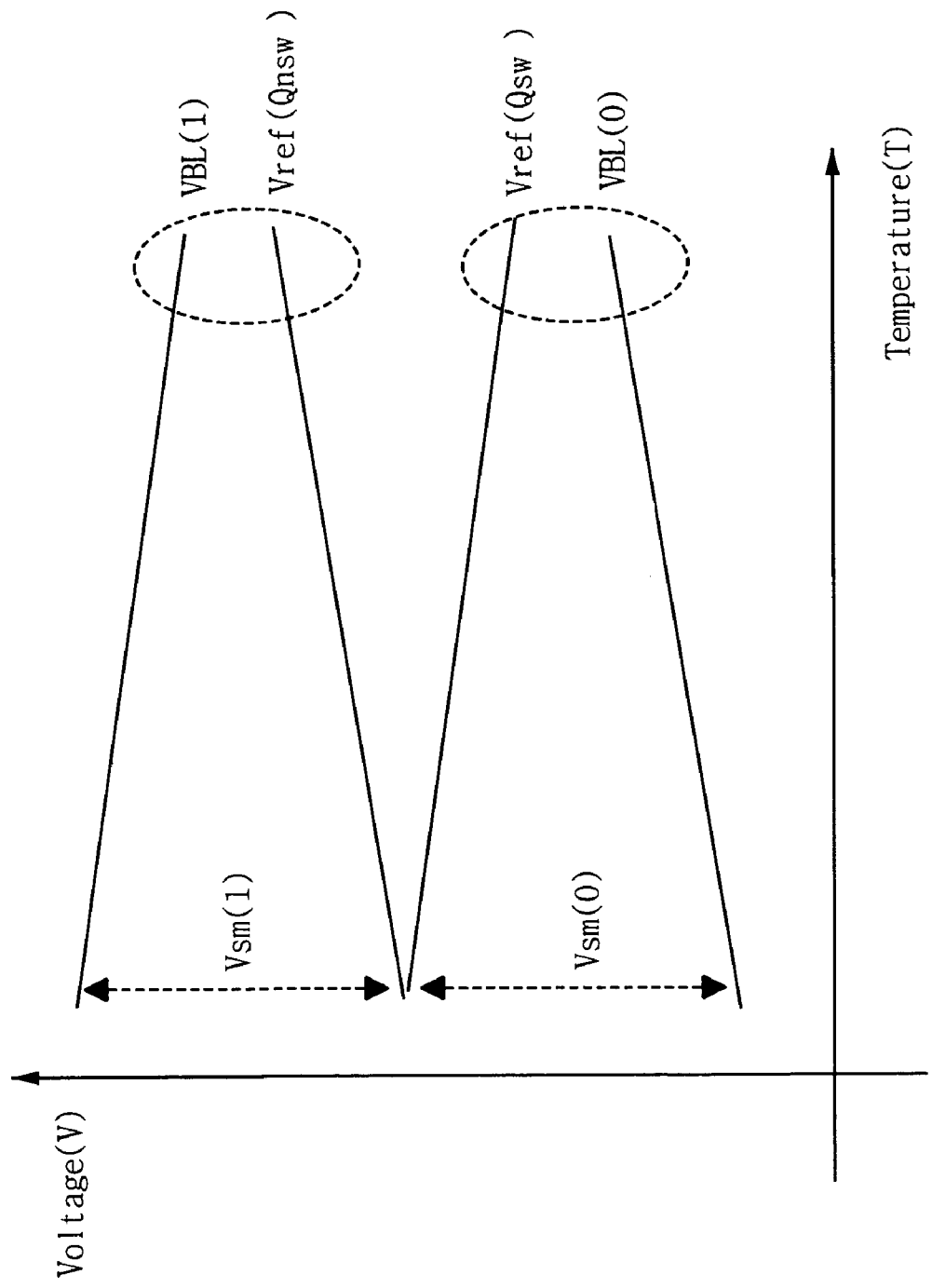
FIG. 5 is a graph illustrating a change in a reference voltage depending on a temperature change in a conventional reference voltage generating device.

The main memory cell array 110 includes memory cells having the structure as shown in FIG. 2. That is, the main memory cell array 10 is configured so that memory cells 20 and 30 is each composed of one ferroelectric capacitor $C_{FE1}$ or $C_{FE2}$ and one access transistor M101 or M102 that are arranged at intersections of rows and columns. Further, the access transistor M101 or M102 constituting the memory cell 120 or 130 is connected to one word line $WL_0$ or $WL_1$. The ferroelectric capacitor $C_{FE1}$ or $C_{FE2}$ constituting the memory cell 120 or 130 has one end connected to a plate line PL and the other end connected to a bit line BL or BLB via the access transistor M101 or M102.

The word lines $WL_0$ and $WL_1$ are connected to each word line decoder and driver circuit (not shown). The plate line PL is connected to a plate line driver circuit (not shown) that provides a plate line enable signal to the plate line PL in response to a plate driver enable signal.

The reference voltage generating device 180 includes a reference cell array 140, a reference word line decoder and driver circuit (not shown) that provides a reference word line enable signal to reference word lines $RWL_0$ and $RWL_1$, and a reference plate line driver (not shown) that provides a reference plate line enable signal RPL_temp to a reference plate line.

The reference cell 150 or 160 constituting the reference cell array 140 is composed of one ferroelectric capacitor $C_{REF1}$ or $C_{REF2}$ and one access transistor RC101 or RC103, such that each cell has an identical or similar structure to that of the ferroelectric main memory cell 120 or 130.

The ferroelectric capacitor $C_{REF1}$ or $C_{REF2}$ constituting the reference cell 150 or 160 may be configured to have capacitance greater than that of the ferroelectric capacitor $C_{FE1}$ or $C_{FE2}$ constituting the memory cell 120 or 130 when the generating device uses the non-switching area capacitance of the ferroelectric capacitor $C_{REF1}$ or $C_{REF2}$. On the other hand, the ferroelectric capacitor $C_{REF1}$ or $C_{REF2}$ constituting the reference cell 150 or 160 may be configured to have capacitance less than that of the ferroelectric capacitor $C_{FE1}$ or $C_{FE2}$ constituting the memory cell 120 or 130 when the generating device uses the switching area capacitance of the ferroelectric capacitor $C_{REF1}$ or $C_{REF2}$.

The reference cell array 140 is configured so that the reference cell 150 or 160 has an identical or similar structure to that of the main memory cell 120 or 130 and is arranged at an intersection between a row and a column. Further, the access transistor RC1 or RC3 of the reference cell 150 or 160 is connected to the reference word line $RWL_0$ or $RWL_1$, the ferroelectric capacitor $C_{REF1}$ or $C_{REF2}$ of the reference cell 150 or 160 has one end connected to the reference plate line to which the reference plate line enable signal RPL_temp is applied, and the other end connected to the bit line BL or BLB via the access transistor RC101 or RC103. The reference cell 150 or 160 may further include transistors RC102 or RC104 connected between the other end of the ferroelectric capacitor $C_{REF1}$ or $C_{REF2}$ and the ground VSS for pre-charging the reference cell 150 or 160 with a pre-charge signal RBP.

The reference word line decoder and driver circuits are connected to the reference word lines $RWL_0$ and $RWL_1$ to provide a reference word line enable signal.

In response to the reference plate line driver enable signal, the reference plate line driver circuit adjusts a voltage level of the reference plate line enable signal RPL_temp depending on temperature change and provides the adjusted reference plate line enable signal to the reference plate line so that a constant reference voltage is generated. The voltage level of the reference plate line enable signal RPL_temp is set to be higher or lower than a set reference level depending on temperature change.

The reference level of the reference plate line enable signal RPL_temp may be set with reference to a power supply voltage level or another voltage level to be suitable for the reference plate line driver circuit. Accordingly, even though the non-switching region capacitance or switching region capacitance of the ferroelectric capacitors $C_{REF1}$ and $C_{REF2}$ constituting the reference cell varies with temperature increase or decrease, it is possible to generate a constant reference voltage by adjusting a voltage level RPL_temp at the reference plate line connected to the ferroelectric capacitor.

The sense amplifiers are connected corresponding to the bit lines BL and BLB which are connected to the main memory cells and the reference cells in common. The sense amplifiers compare a voltage level of positive bit lines BL and BLB connected to the main memory cell to a voltage level of the negative bit lines BLB and BL connected to the reference cell in order to sense and read data in a selected main memory cell.

Additionally, the reference cell may include transistors Q101 and Q102 for pre-charging the bit lines BL and BLB with the bit line pre-charge signal PRE.

Figure 7:
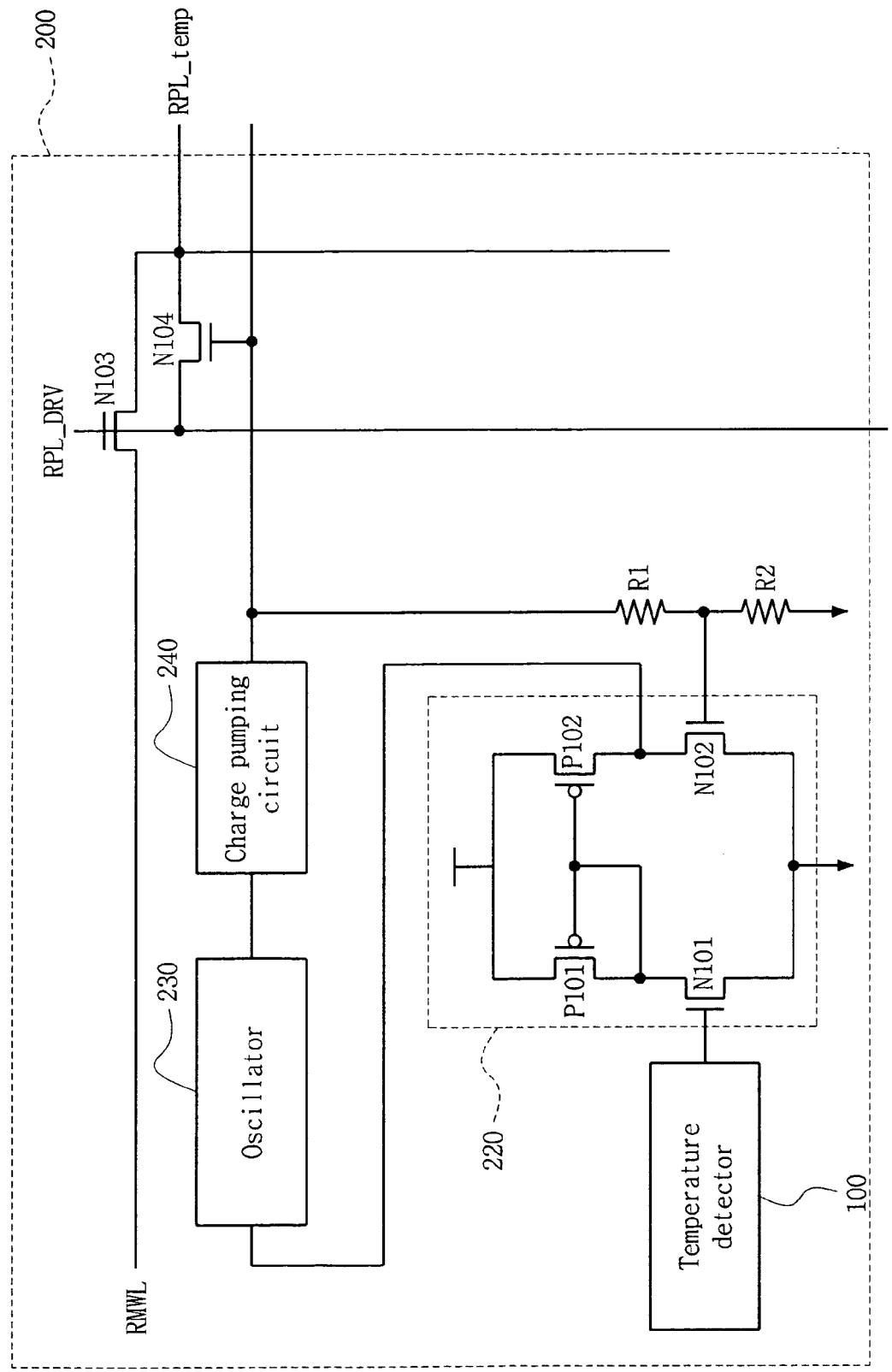
FIG. 7 is a block diagram illustrating an implementation example of a reference plate line driver circuit that generates a reference plate line enable signal as shown in FIG. 6.

FIG. 7 illustrates an implementation example of the reference plate line driver circuit that generates the reference plate line enable signal RPL_temp as shown in FIG. 6.

As shown in FIG. 7, the reference plate line driver circuit 200 includes a temperature detector 100, a current mirror type differential amplifier 220, an oscillator 230, a charge pumping circuit 240, resistors R1 and R2, and switching devices N103 and N104.

When an external temperature changes, the temperature detector 100 outputs an output signal at a voltage level corresponding to the changing external temperature. The temperature detector 100 may be differently configured depending on whether the reference voltage generating device uses the non-switching area capacitance or the switching area capacitance of the ferroelectric capacitor. This means that when the reference voltage generating device uses the non-switching area capacitance, the temperature detector 100 may be configured to output the voltage having a negative temperature coefficient and thus a level lower than that at a room temperature upon increase in the external temperature. When the reference voltage generating device uses the switching area capacitance, the temperature detector 100 may be configured to output the voltage having a positive temperature coefficient and thus a level higher than that at a room temperature upon increase in the external temperature.

The current mirror type differential amplifier 220 amplifies, stabilizes and outputs the output signal from the temperature detector 100. The current mirror type differential amplifier 220 is controlled by the output signal from the temperature detector 100 and by an output signal from the charge pumping circuit 240 divided by a voltage divider composed of the resistors R1 and R2.

The oscillator 230 generates a pulse in response to the output from the current mirror type differential amplifier 220.

The charge pumping circuit 240 generates a control signal in response to the pulse generated by the oscillator 230. The charge pumping circuit 240 may be configured by applying a typical word line boosting circuit.

The NMOS transistor N104 that is a switching device receives the control signal at the gate and provides an applied reference plate line enable signal PRL_DRV as the reference plate line enable signal RPL_temp to the reference plate line. In the reference voltage generating device using the non-switching area capacitance of the ferroelectric capacitor constituting the reference cell, the reference plate line enable signal RPL_temp may be set to have a power supply voltage VCC level as the reference level at a room temperature, a voltage level lower than the power supply voltage level at a higher temperature, and a voltage level higher than the power supply voltage level at a lower temperature. On the other hand, in the reference voltage generating device using the switching area capacitance of the ferroelectric capacitor constituting the reference cell, the reference plate line enable signal RPL_temp may be set to have the power supply voltage VCC level as the reference level at a room temperature, a voltage level higher than the power supply voltage level at a higher temperature, and a voltage level lower than the power supply voltage level at a lower temperature.

The NMOS transistor N103, which is a switching device, is turned on by the applied reference plate line enable signal PRL_DRV and delivers a reference main word line signal RMWL to a reference word line decoder and driver circuit so that a reference word line is selected.

It will be apparent to those skilled in the art that a reference plate line driver circuit may be configured with a negative temperature coefficient or a positive temperature coefficient by various applications and methods, as well as the reference plate line driver circuit 200 as shown in FIG. 7.

Figure 8:
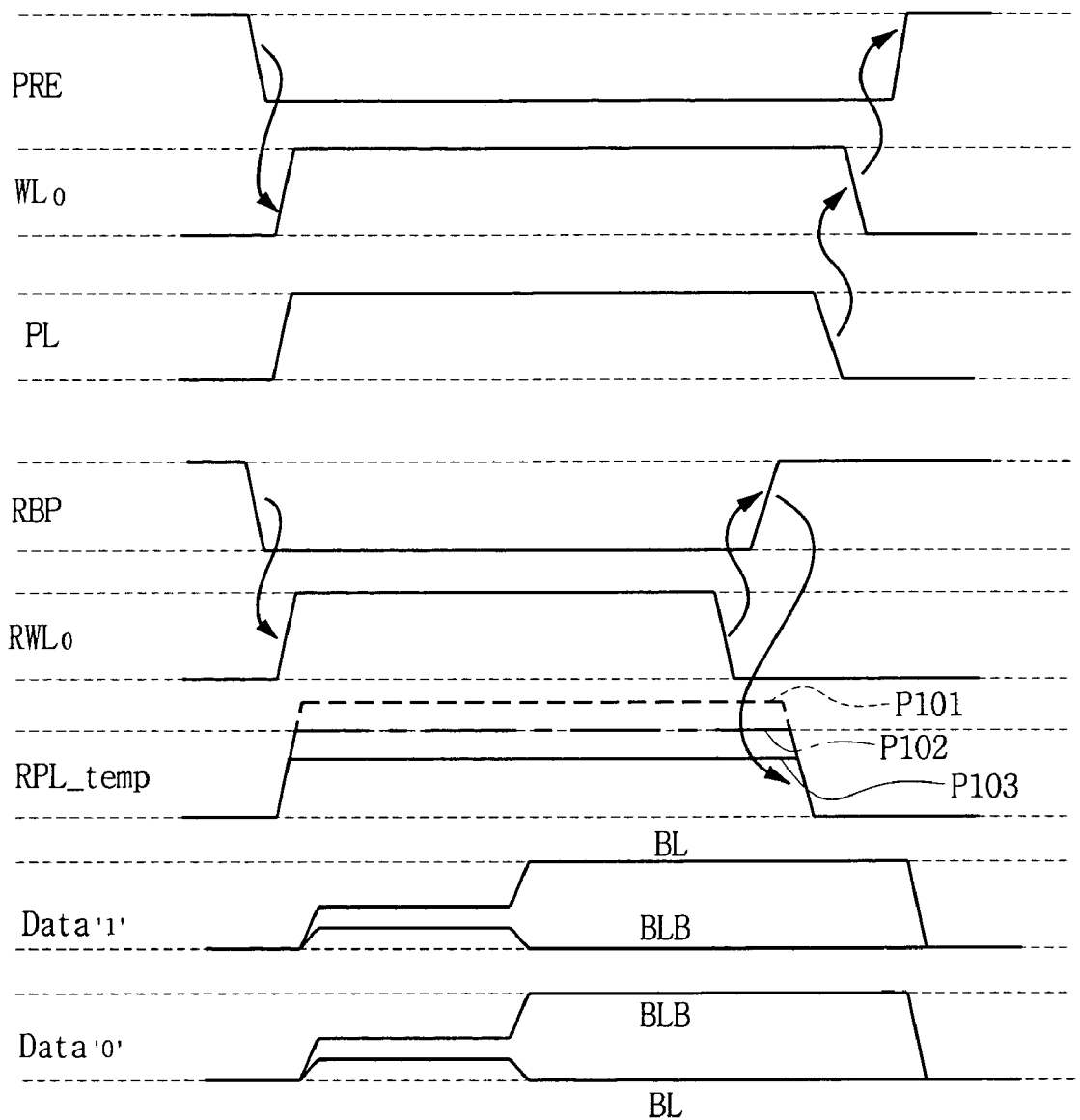
FIG. 8 is a timing diagram showing data in a main memory cell of the conventional ferroelectric random access memory device of FIG. 6.

FIG. 8 is a timing diagram based upon reading of data in a main memory cell of the ferroelectric random access memory device of FIG. 6. The operation timing diagram will be discussed in conjunction with an example in which the data stored in the memory cell 120 is read in.

As shown in FIGS. 6 and 8, before read operation is initiated, a pre-charge signal PRE on the positive bit line BL connected to the memory cell 120 and the negative bit line BLB connected to the reference cell 160 is enabled, pre-charging the bit lines. As soon as the read operation is initiated, the pre-charge signal PRE on the positive bit line BL and the negative bit line BLB is disabled. A pre-charge signal RBP on the reference cell 160 is also disabled.

The word line $WL_0$ and the reference word line $RWL_0$, which are selected by the word line enable signal and the reference word line enable signal, respectively, are then enabled, and the plate line PL is enabled. Further, the reference plate line is enabled at a constant level. The reference plate line is enabled by the reference plate line enable signal RPL_temp which has a different voltage level P101, P102 or P103 depending on temperature change. For example, when the reference cell is configured by a ferroelectric capacitor using the non-switching area capacitance, the reference plate line enable signal has a negative temperature coefficient, and when the reference cell is configured by a ferroelectric capacitor using the switching area capacitance, the reference plate line enable signal has a positive temperature coefficient.

When a voltage (i.e., data '1' or '0') corresponding to data in the selected main memory cell 120 is exited to the positive bit line BL and a reference voltage is provided to the negative bit line BLB to which the reference cell 160 is connected, the sense amplifier senses a voltage difference between the bit lines BL and BLB to read the data.

When the data stored in the memory cell 120 is data '0' as the reference word line $RWL_0$ is disabled before the sense amplifier completes the data sensing operation, the data in the reference cell 160 should not be inverted. The reference pre-charge signal RBP is then disabled and the reference plate line RPL is disabled. Further, after the plate line PL is disabled, the word line $WL_0$ is disabled such that data in the memory cell returns as original data. The bit line pre-charge signal PRE is then enabled.

Figure 9:
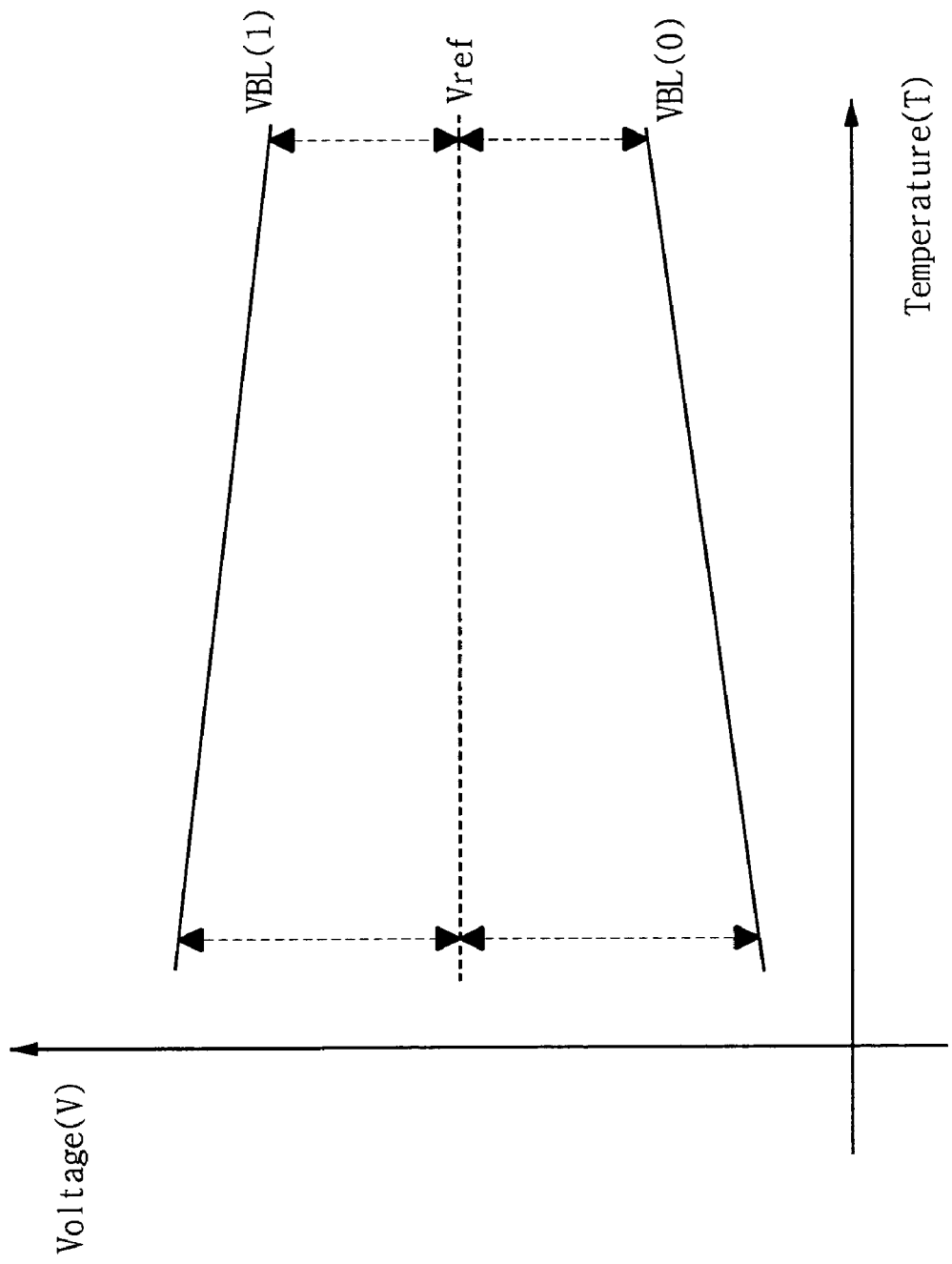
FIG. 9 is a graph illustrating a change in a reference voltage depending on temperature change in the reference voltage generating device of FIG. 6.

FIG. 9 is a graph illustrating a change in a reference voltage V depending on temperature T change in the reference voltage generating device of FIG. 6.

As a temperature T increases, a bit line voltage VBL(1) corresponding to data '1' stored in the memory cell decreases at a certain rate while a bit line voltage VBL (0) corresponding to data '0' increases at a certain rate, as shown in FIG. 9. In this case, the reference voltage Vref generated by the reference voltage generating device according to at least one embodiment of the present invention is always kept unchanged as an intermediate voltage between the bit line voltage VBL(1) corresponding to the data '1' stored in the memory cell and the bit line voltage VBL (0) corresponding to the data '0'. Accordingly, the reference voltage generating device in the ferroelectric random access memory according to at least one embodiment of the present invention is capable of providing a reference voltage at a constant level which is not changed even with temperature change.

Figure 1:
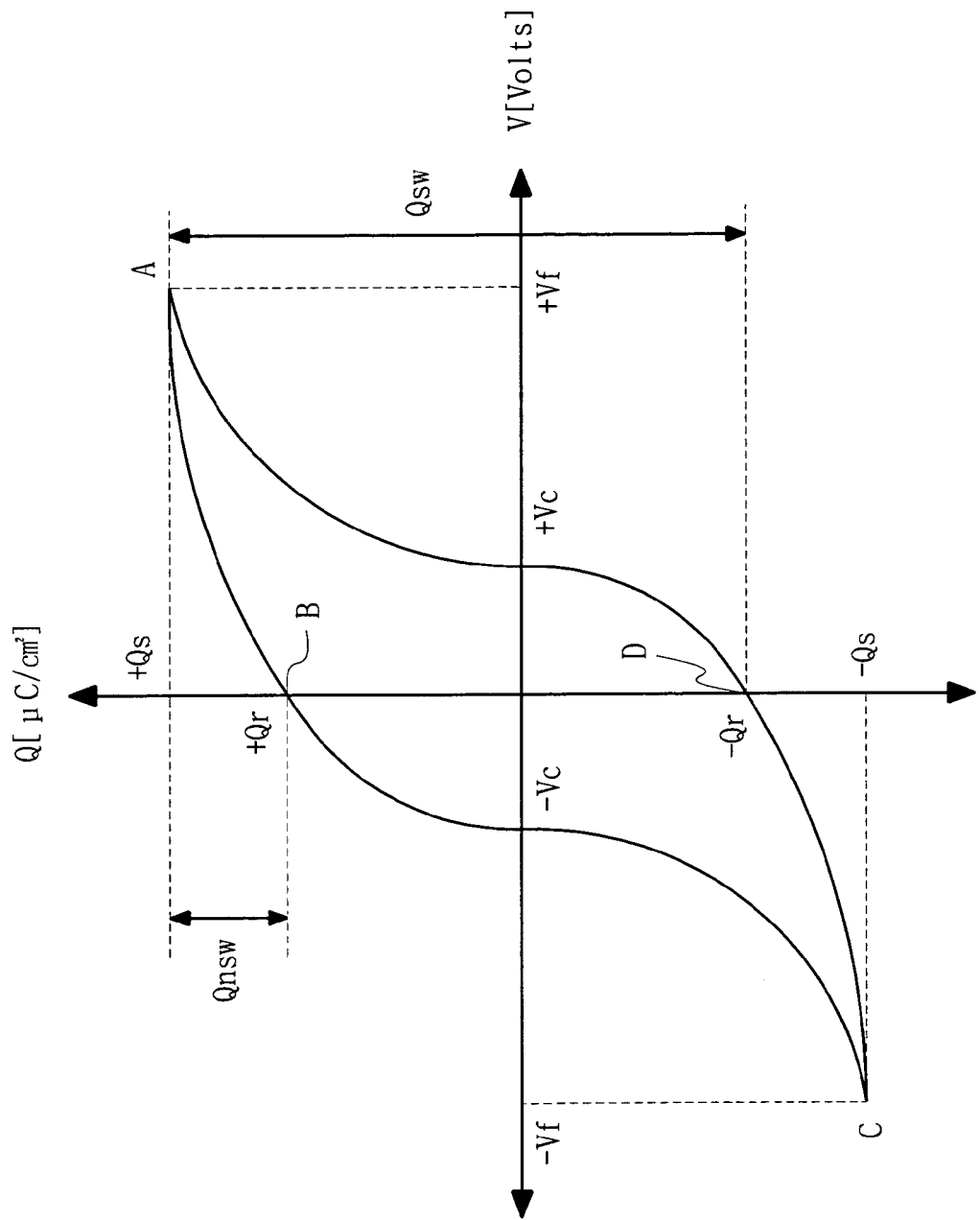
FIG. 1 illustrates a hysteresis curve of a ferroelectric material of a ferroelectric capacitor.

Although it has been described in an embodiment of the present invention that the data '0' corresponds to the state point B on the hysteresis curve of FIG. 1 and the data '1' corresponds to the state point D, it will be apparent to those skill in the art that the data '1' may correspond to the state point B and the data '0' may correspond to the state point D. Further, it will be apparent to those skill in the art that the non-switching area capacitance and the switching area capacitance of a ferroelectric capacitor constituting a reference cell may be easily defined differently as the corresponding state point of the data '1' and data '0' varies.

As described above, in at least one embodiment of the invention it is possible to implement a reference voltage generating device capable of generating a constant reference voltage which is not changed even with temperature change by adjusting a level of a plate line enable signal depending on the temperature change.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A device for generating a reference voltage in a ferroelectric random access memory, the device comprising:
a reference cell having a ferroelectric capacitor and at least one transistor;
a reference plate line connected to one end of the ferroelectric capacitor; and
a reference plate line driver circuit for adjusting a voltage level of a reference plate line enable signal depending on temperature change.

2. The device according to claim 1, further comprising:
an access transistor connected between the other end of the ferroelectric capacitor and a bit line, the access transistor having a gate connected to a reference word line.

3. The device according to claim 2, wherein the reference cell further comprises:
a transistor connected between the other end of the ferroelectric capacitor to which the access transistor is connected and a ground for precharging the reference cell.

4. The device according to claim 2, wherein the ferroelectric capacitor in the reference cell has a capacitance greater than that of a ferroelectric capacitor in a memory cell of the FRAM.

5. The device according to claim 4, wherein the reference voltage is generated by using non-switching area capacitance of the ferroelectric capacitor in the reference cell.

6. The device according to claim 5, wherein the voltage level of the reference plate line enable signal has a negative temperature coefficient.

7. The device according to claim 6 wherein, the reference plate line driver circuit comprises:
a temperature detector for outputting a voltage of a level corresponding to temperature change;
a current mirror type differential amplifier for amplifying the signal output from the temperature detector;
an oscillator for generating a pulse in response to an output from the differential amplifier;
a charge pumping circuit for generating a control signal in response to the pulse generated by the oscillator; and
a switching device for generating the reference plate line enable signal in response to the control signal.

8. The device according to claim 2, wherein the ferroelectric capacitor in the reference cell has capacitance smaller than that of the ferroelectric capacitor in the memory cell.

9. The device according to claim 8, wherein the reference voltage is generated by using switching area capacitance of the ferroelectric capacitor in the reference cell.

10. The device according to claim 9, wherein the voltage level of the reference plate line enable signal has a positive temperature coefficient.

11. The device according to claim 10, wherein the reference plate line driver circuit comprises:
a temperature detector for outputting a voltage of a level corresponding to temperature change;
a current mirror type differential amplifier for amplifying the signal output from the temperature detector;
an oscillator for generating a pulse in response to an output from the differential amplifier;
a charge pumping circuit for generating a control signal in response to the pulse generated by the oscillator; and
a switching device for generating the reference plate line enable signal in response to the control signal.

12. A method for driving a reference voltage generating device for a ferroelectric random access memory including memory cells each of which having one ferroelectric capacitor and one access transistor, the method comprising:
applying a reference driver enable signal to the reference voltage generating device;
controlling a voltage level of a reference plate line enable signal by means of a control signal having a voltage level corresponding to temperature change, the reference plate line enable signal being applied to a reference plate line connected to a reference cell; and
generating a reference voltage having a constant level in response to the controlled reference plate line enable signal.

13. The method according to claim 12, wherein the reference voltage is generated by using non-switching area capacitance of the ferroelectric capacitor constituting the reference cell.

14. The method according to claim 13, wherein the voltage level of the reference plate line enable signal has a negative temperature coefficient.

15. The method according to claim 12, wherein the reference voltage is generated by using switching area capacitance of the ferroelectric capacitor constituting the reference cell.

16. The method according to claim 15, wherein the voltage level of the reference plate line enable signal has a positive temperature coefficient.

* * * * *